United States Patent [19]
Narayanan et al.

[11] Patent Number: 5,983,376
[45] Date of Patent: Nov. 9, 1999

[54] AUTOMATED SCAN INSERTION FLOW FOR CONTROL BLOCK DESIGN

[75] Inventors: Sridhar Narayanan, Sunnyvale; Yuncheng F. Yu, Palo Alto; Arthur Lin, San Jose; Hongyu Li, Hayward, all of Calif.

[73] Assignee: Sun Microsystems, Inc., Palo Alto, Calif.

[21] Appl. No.: 08/935,470

[22] Filed: Sep. 24, 1997

[51] Int. Cl.$^6$ .................................................. G01R 31/28
[52] U.S. Cl. .......................... 714/726; 714/727; 714/729
[58] Field of Search .................................. 714/726, 727, 714/729, 733, 734, 724; 324/76.1, 158.1; 365/201

[56] References Cited

U.S. PATENT DOCUMENTS

| | | | |
|---|---|---|---|
| 5,717,700 | 2/1998 | Crouch et al. | 371/22.3 |
| 5,859,860 | 1/1999 | Whetsel | 371/33.32 |

OTHER PUBLICATIONS

"IEEE Standard Test Access Port and Boundary–Scan Architecture," Published by the Institute of Electrical and Electronics Engineers Inc., New York, NY, Oct. 21, 1993, pp. 1–1–1–5.

Savir et al., "At–Speed Test is Not Necessarily an AC Test," 1991 IEEE, International Test Conference 1991, paper 26.3, pp. 722–727.

Varma, "On Path Delay Testing in a Standard Scan Environment," 199 IEEE, International Test Conference 1994, pp. 164–173.

Crouch et al., "Testability Features of the MC68060 Microprocessor," 1994 IEEE, International Test Conference 1994, pp. 60–69.

*Primary Examiner*—Hoa T. Nguyen
*Attorney, Agent, or Firm*—Conley, Rose & Tayon; Lawrence J. Merkel; B. Noel Kivlin

[57] ABSTRACT

In a control block design methodology, control block design proceeds without the inclusion of scan functionality until the functional design specifications are met. After meeting the functional design specifications, a scan insertion tool is executed to automatically insert scan functionality. The insertion is performed in such a manner that the functional cells within the control block are not perturbed. Therefore, functional timing may be minimally affected, if at all. In one embodiment, a scan enable buffer is inserted at the end of each row in the control block. Flops (or other scannable storage devices) within the row are connected to the scan enable line provided by the scan enable buffer within the row. Additionally, flops are connected into a scan chain on a row-by-row basis, minimizing the length of the wires connecting the scan chain. If a particular scan chain wire exceeds a length which will meet scan timing requirements, a scan chain buffer can be inserted as well (e.g. at the end of the row).

18 Claims, 9 Drawing Sheets

AUTOMATED SCAN INSERTION FLOW FOR CONTROL BLOCK DESIGN

BACKGROUND OF THE INVENTION

1. Field of the Invention

This invention relates to scan testing functionality for integrated circuits and, more particularly, to inserting scan functionality into a control block of an integrated circuit.

2. Description of the Related Art

Integrated circuits comprise millions of transistors fabricated upon a semiconductor substrate, interconnected by several metal wiring layers placed atop the semiconductor substrate. Manufacturing defects may occur in any of the transistors or in the metal interconnect, causing the integrated circuit not to function properly. Various faults may occur, including stuck-at faults in which a node is stuck at a particular value which is not correct given the state of the integrated circuit; open faults in which an open circuit exists; short faults in which a short circuit exists; etc. To ensure delivery of a quality product to the integrated circuit consumer, designing a high degree of fault testability (or simply "testability") into the integrated circuit is of critical importance.

One method for providing testability in control blocks of an integrated circuit is designing scan test functionality into the control block. Control blocks generally comprise combinatorial logic gates which receive inputs from storage devices and provide outputs to storage devices. The input and output storage devices are clocked with a clock signal which causes the storage devices to periodically capture the value provided to the storage devices. The captured value is provided as an output of the storage device until the next value is captured. Between the periodic captures, the combinatorial logic evaluates and generates new input values. Control blocks embody the control logic which operates data flow elements within the integrated circuit in order to provide the functionality specified for the integrated circuit.

Scan testing involves scanning values into the storage devices of the control block, allowing the combinatorial logic within the control block to evaluate, clocking results of the evaluation into the storage devices, and scanning the results out of the storage devices. Based upon a model of the combinatorial logic design, the expected results for any set of inputs can be determined. If the measured results match the expected results, then the test passes. If the measured results do not match the expected results, the test fails. A set of input patterns (and corresponding expected results) are generated to test for the largest possible number of faults. While generating a set of all possible input patterns would theoretically lead to 100% fault coverage, the number of input patterns would be prohibitive. However, a high degree of test coverage may be achieved by using a much smaller number of patterns. Scan testing effectiveness can be measured as a percentage of all possible faults which are tested by the set of input patterns used. Typically, greater than 95% of the faults tested is required. Often, greater than 99% of the faults can be tested.

In order to scan inputs into the storage devices and scan results out of the storage devices, the storage devices are interconnected in a serial chain (or "scan chain"). One of the storage devices forms the end of the chain, and receives a scan input provided from an input pin to the integrated circuit. Another one of the storage devices forms the other end of the chain, and provides a scan output provided to an output pin of the integrated circuit. The chain of storage devices effectively forms a scan register. The scan register operates as a shift register to allow values to be scanned in and out of the storage devices forming the scan register.

Inserting scan functionality into a control block design involves at least: (i) distributing a scan enable to the storage devices within the control block, the scan enable indicating when scanning of values into or out of the storage devices is being performed; and (ii) connecting the devices together into a scan chain. Unfortunately, inserting scan functionality into a control block design complicates the design process. In addition to iterating the design to meet functional specifications and design requirements, the designer must design the scan functionality. The design must meet timing requirements for the scan enable and scan chain signals, increasing the timing design effort. Additionally, the scan enable and scan chain signals must be routed throughout the control block. Wiring congestion within the control block may be increased, which may impact functional timing. Additionally, placement and routing of logic and storage elements may be impacted by the scan requirements. If logic elements and storage elements which are interconnected are moved farther apart due to scan functionality, functional timing may again be affected. An effective method for inserting scan testing into a control block design is therefore desirable.

SUMMARY OF THE INVENTION

The problems outlined above are in large part solved by a control block design methodology in accordance with the present invention. In the methodology described herein, control block design proceeds without the inclusion of scan functionality until the functional design specifications are met. After meeting the functional design specifications, a scan insertion tool is executed to automatically insert scan functionality. The insertion is performed in such a manner that the functional cells within the control block are not perturbed. Therefore, functional timing may be minimally affected, if at all. Advantageously, scan functionality is included within the control block. However, the designer of the control block is insulated from the details of scan. Additionally, because the scan functionality is excluded from design iteration until the functional specifications are met, a highly efficient placement and interconnection of functional cells may be achieved. If scan functionality were inserted early in the design iteration process, cells which have scan interconnections may be placed more closely together at the expense of functional timing.

In one embodiment, a scan enable buffer is inserted at the end of each row in the control block. Flops (or other scannable storage devices) within the row are connected to the scan enable line provided by the scan enable buffer within the row. Additionally, flops are connected into a scan chain on a row-by-row basis, minimizing the length of the wires connecting the scan chain. If a particular scan chain wire exceeds a length which will meet scan timing requirements, a scan chain buffer can be inserted as well (e.g. at the end of the row). Performing scan insertion in this manner may lead to a relatively small amount of scan buffering and a relatively small amount of design perturbation due to the added scan functionality. Since the buffers are added in predefined locations (e.g. the ends of the rows), functional cells within the rows may be frozen in place prior to adding the buffers. Therefore, functional cells should maintain relative positioning to each other and as a result maintain timing characteristics generated prior to adding the scan functionality.

Broadly speaking, the present invention contemplates a method for scan insertion into a control block. At least one scan enable buffer is inserted at an end of a row of cells within the control block. An output of the scan enable buffer is coupled to a scan enable port of at least one scannable storage device within the row. The scannable storage devices are connected into a scan chain.

The present invention further contemplates a method for designing a control block including scan functionality. The control block is designed exclusive of scan functionality. The control block comprises a plurality of rows of cells. A first scan enable buffer is inserted at an end of a first one of the plurality of rows upon completing the designing of the control block. An output of the first scan enable buffer is connected to a scan enable port upon each of a first plurality of scannable storage devices within the first one of the plurality of rows. The first plurality of scannable storage devices are connected into a scan chain.

Moreover, the present invention contemplates a computer storage medium configured to store a scan stitching program including a plurality of instructions configured to: (i) insert at least one scan enable buffer into a high level design language (HDL) description of a control block; (ii) connect an output of the scan enable buffer to a scan enable port upon each of a plurality of scannable storage devices within the HDL description, wherein the plurality of scannable storage devices are within one of a plurality of rows of the control block as defined within a corresponding physical layout description of the control block; and (iii) connect the plurality of scannable storage devices into a scan chain, wherein the scan chain is built between the plurality of scannable storage devices according to a minimum Manhattan distance between scan-in ports and scan-out ports of the plurality of scannable storage devices.

BRIEF DESCRIPTION OF THE DRAWINGS

Other objects and advantages of the invention will become apparent upon reading the following detailed description and upon reference to the accompanying drawings in which.

Figure 1:
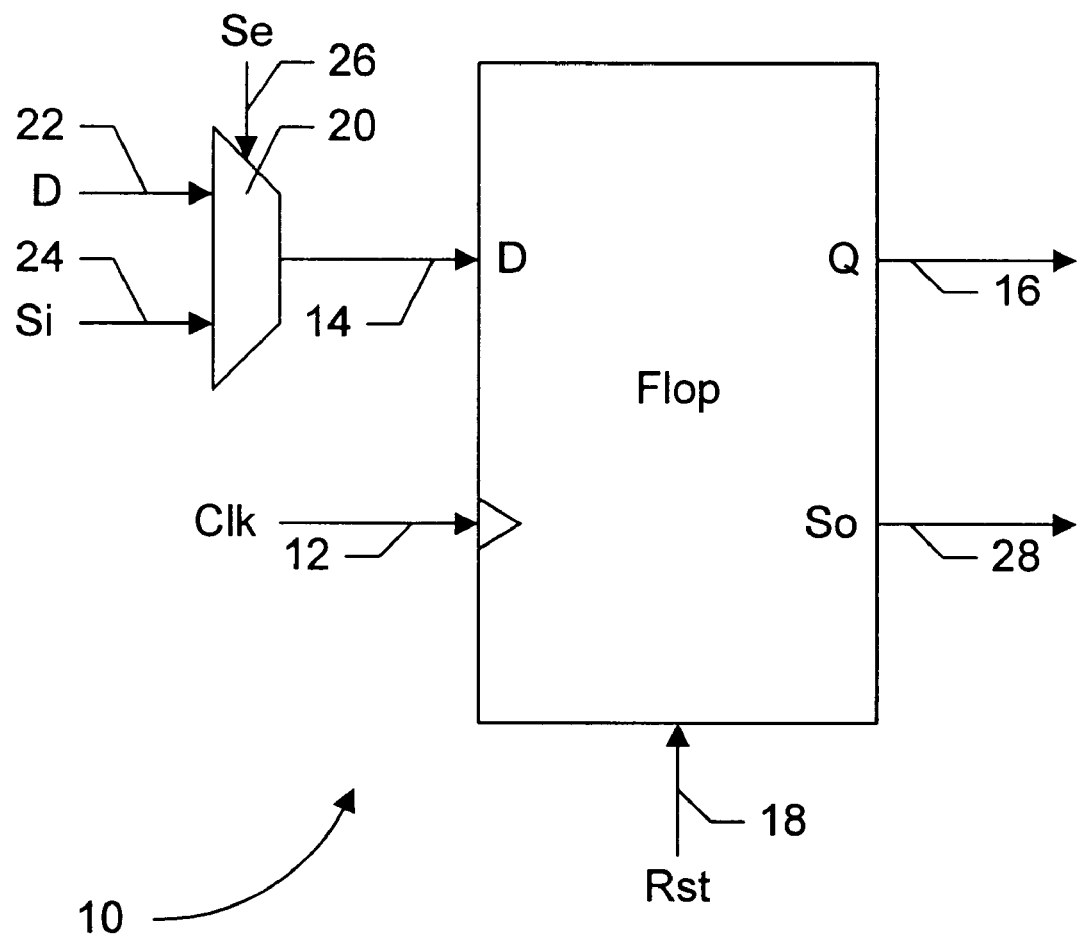
FIG. 1 is a block diagram of one embodiment of a flop including scan ports.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of an exemplary scannable storage device is shown. The exemplary storage device is a flip-flop (or "flop") 10, which will be used as an example throughout the remainder of this specification. However, any scannable storage device may be used. Generally, a scannable storage device is a device configured to capture an input value in response to a clock signal and to provide that input value as an output (also in response to the clock signal), and the device is also configured to support scan functionality. The scannable storage device is configured to receive a scan enable signal and can be connected into a scan chain with other scannable storage devices.

A flop such as flop 10 is an edge-triggered storage device. Upon a given edge of the clock signal upon the clock input 12 of flop 10 (e.g. the rising edge), the input 14 of the flop is stored and propagates to the output 16. The propagation time between the triggering clock edge and the input 14 arriving upon the output 16 is a function of the transistors forming flop 10 (i.e. not a function of other edges of the clock signal upon clock input 12). Flop 10 further includes a reset input 18. If the reset signal upon reset input 18 is asserted, the output 16 is forced to a reset state independent of the input signal input 14. The reset state may be binary zero, for example.

Flop 10 is configured for scan functionality as well. A multiplexor 20 is included for selecting between a functional input 22 and a scan-in input 24. The input signal upon functional input 22 is provided by combinatorial logic to which flop 10 is connected. During normal (non-scan) operation, functional input 22 is selected by multiplexor 20. Scan-in input 24 is provided for connecting flop 10 into a scan chain. Scan-in input 24 is connected to the scan output of a different flop 10 (or to receive the scan input provided to the control block including flop 10, if flop 10 is the first device in the scan chain). A scan enable input 26 is connected as the selection control for multiplexor 20. If the scan enable signal upon scan enable input 26 is asserted, scan-in input 24 is selected by multiplexor 20. If the scan enable signal is deasserted, functional input 22 is selected by multiplexor 20.

Additionally, flop 10 includes a scan-out output 28. Scan-out output 28 generally provides an identical state as output 16 provides. However, scan-out output 28 is used to connect to a scan-in input 24 of another flop. In this manner, output 16 may be isolated from the load of the scan chain.

It is noted that FIG. 1 illustrates flop 10 in a block format. However, flop 10 is fabricated into an integrated circuit using a number of transistors. A physical design for flop 10 defines the transistors which comprise flop 10, as well as their orientation with respect to each other, interconnection, etc. The physical design of flop 10 is referred to as the "cell" for flop 10, and the dimensions of the cell are used to physically instantiate flop 10 in a control block layout. Generally speaking, a "cell" is a predesigned circuit which implements a particular function. The function may be storage (e.g. flop 10), combinatorial (e.g. a logic gate or set of logic gates), or a combination thereof. Instantiations of the cell can generally be rotated 90 degrees in either direction or flipped vertically or horizontally. Additionally, connection points for each input or output of the cell are defined within the cell. A wire to be connected to a particular input or output is routed to the corresponding connection point within a cell instantiation in order to be connected. The connection point is referred to as a "port" of the cell. Clock input 12, output 16, reset input 18, input 22, scan-in input 24, scan enable input 26, and scan-out output 28 are each provided a port on the cell definition for flop 10.

Figure 2:
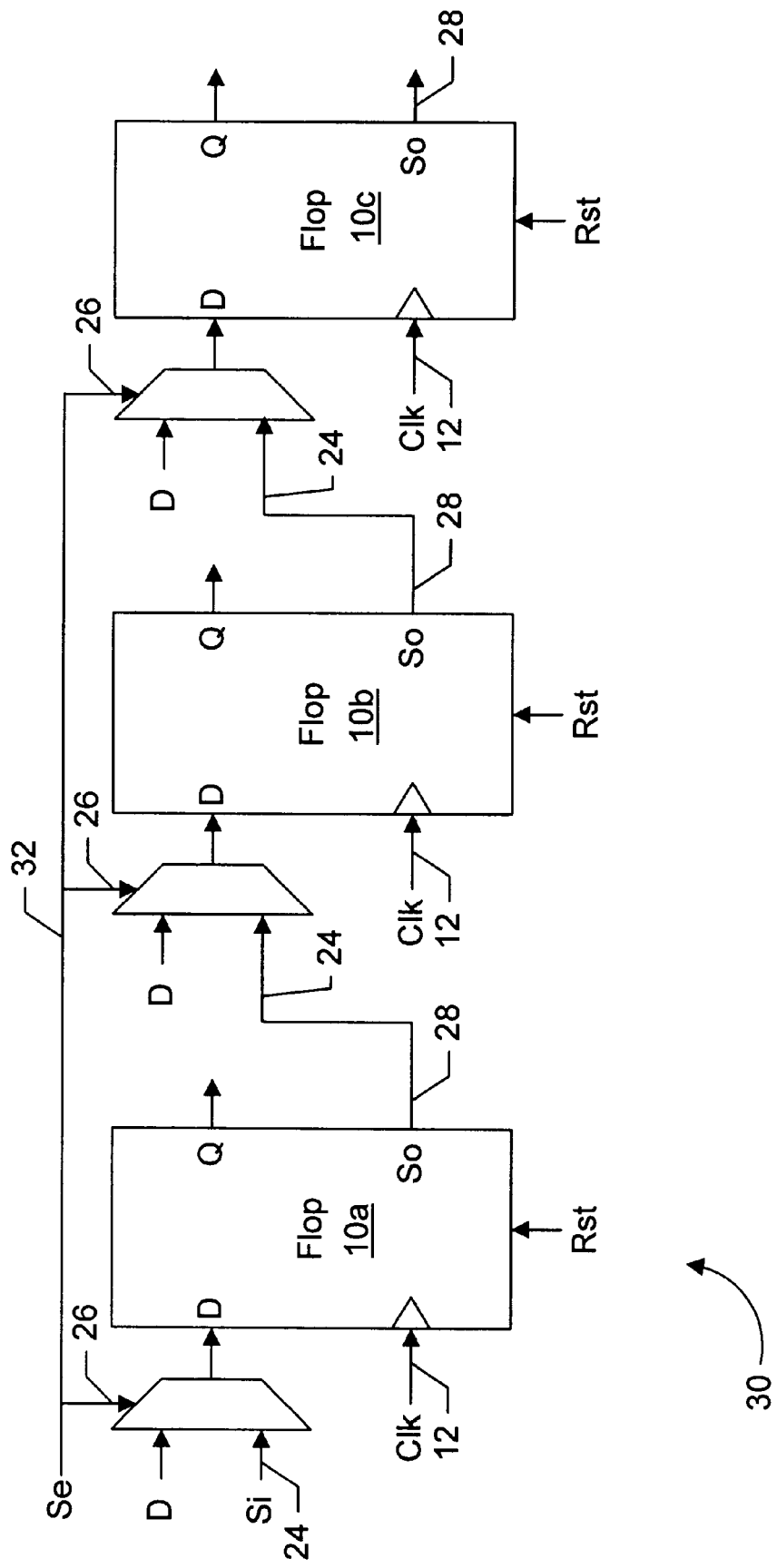
FIG. 2 is a block diagram illustrating one embodiment of a scan chain including the flop shown in FIG. 1.

FIG. 2 illustrates several instantiations of flop 10 (flops 10a, 10b, and 10c) connected into an exemplary scan chain 30. Each instantiation 10a–10c includes all the ports of flop 10 as shown in FIG. 1. Each of the scan enable ports 26 of flops 10a, 10b, and 10c are coupled to a scan enable line 32. When scanning is desired, the scan enable signal upon scan enable line 32 is asserted. Each of the flops 10a–10c select the corresponding scan-in inputs 24. Scan-in input 24 of flop 10b is connected to scan-out output 28 of flop 10a. Similarly, scan-in input 24 of flop 10c is connected to scan-out output 28 of flop 10b. Therefore, when the scan enable signal upon scan enable line 32 is asserted, flops 10a–10c are connected in a chain. Clock pulses upon clock inputs 12 cause flops 10a–10c to operate as a shift register as long as scan enable line 32 is asserted.

A scan pattern can be shifted into scan chain 30 by asserting the scan enable signal and asserting clock pulses upon clock lines 12. The scan enable signal may then be deasserted, and one clock pulse provided upon clock inputs 12 to capture the evaluation of combinatorial logic coupled to flops 10a–10c. Then scan enable line may then be asserted to scan out the results captured by flops 10a–10c. The results may be compared to a set of expected results to determine a pass or fail result for the test.

Figure 3:
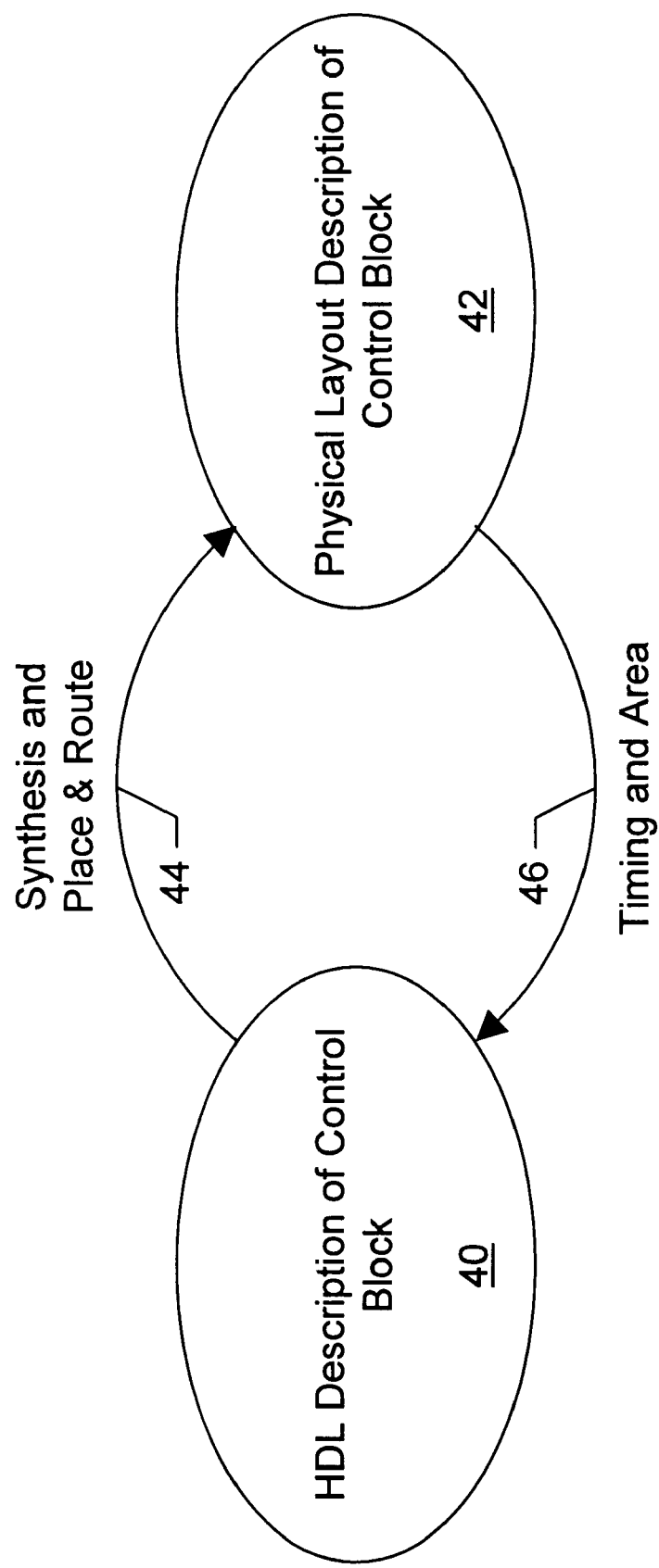
FIG. 3 is a diagram illustrating two descriptions of a control block design.

Turning now to FIG. 3, a diagram illustrating two descriptions of a control block and iteration therebetween during the design process is shown. Typically, a high level design language (HDL) description 40 of the control block is coded by the control block designer. Exemplary HDLs are Verilog, VHDL, etc. HDLs are used because it is relatively simple to code complex control equations as compared to attempting to draw schematics of the control equations.

After coding the HDL description, the designer generally uses a design tool to perform synthesis and place and route functions (arrow 44) upon the HDL description, thereby generating a physical layout description 42 of the control block. The physical layout description identifies each cell within the control block, the position of each cell within the control block, and the orientation of the cell. As shown below, control blocks are generally organized as rows of cells separated by wiring channels. The physical layout description may therefore include a row number and a position within the row for each cell. During synthesis, a library of available cells (including flop cells and combinatorial logic cells) are used to realize the control equations provided in the HDL description. A netlist is produced by synthesis, which includes a list of cell instantiations (i.e. a cell may be replicated as often as desired within a control block). Signal names are assigned to each port of the cell instantiations, and the use of the same signal name upon two different ports indicates a connection between those ports. Synthesis is generally provided with a set of rules which increase the likelihood that the netlist provided may meet functional timing requirements. For example, the maximum load upon a given signal may be specified (e.g. a maximum fanout). If the load is exceeded, the tool may insert buffering to reduce the load.

During place and route, the cells listed in the netlist are placed onto a control block layout and metal interconnect is provided to connect the cells as defined by the netlist. Factors in placing the cells include attempting to place interconnected cells in close proximity as well as maintaining the smallest possible total area occupied by the control block layout. An exemplary tool for performing synthesis and place and route is the Arccell tool available from Avant! Corporation, Fremont, Calif.

Once a physical layout description has been generated, control block timing and area information is extracted (arrow 46). If timing and area specifications for the control block have not been met, the control block designer modifies the HDL description 40 to result in a design which meets timing and area specifications. Additionally, functional verification may lead to corrections in the HDL description. The modifications are then passed back through synthesis and place and route to generate physical layout description 42. The process of modifying, synthesizing, place and route, and timing extraction is iterated until the design meets timing and area specifications.

Figure 4:
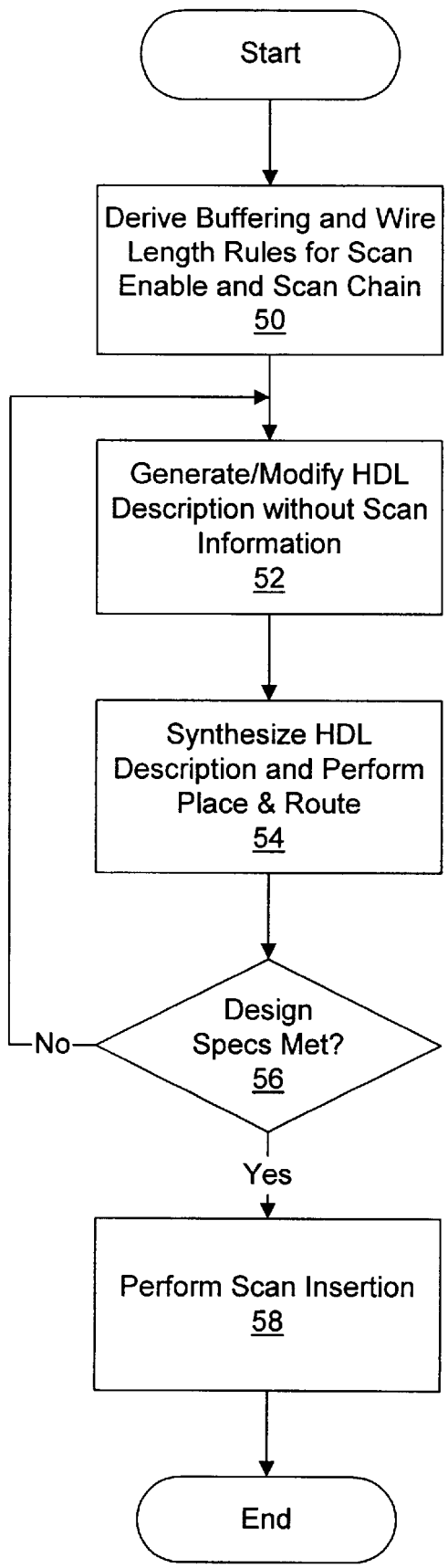
FIG. 4 is a flowchart illustrating a design methodology for inserting scan functionality.

Turning now to FIG. 4, a flowchart illustrating a design methodology for inserting scan functionality into a control block design is shown. As illustrated at step 50, buffering and wire length rules for the scan enable lines and the scan chain interconnect are derived. These rules are dependent upon the buffer cells available in the cell library as well as the semiconductor fabrication technology in which the control block is to be implemented. The rules can be derived by, for example, performing spice simulations of various line lengths and loads and their effect upon the buffers which are available. The rules are devised to ensure that setup and hold times and slew rate for the scan enable and scan chain interconnect are met. The buffering rules may be a limit upon the amount of load that a given buffer can drive (including the output buffer within flop 10 which drives the scan-out output 28), and the amount may be expressed as a capacitance or as a maximum fanout. Additionally, the wire length limit may be specified as a length (e.g. number of microns). Exceeding the wire length limit requires the insertion of a buffer. It is noted that scan testing is often performed at a lower clock frequency than that specified for the integrated circuit. Therefore, scan timing rules may vary from timing rules employed for the functional portion of the design.

In one exemplary embodiment, the following buffering and wire length rules are observed (although any suitable set of buffering and wiring length rules may be derived): The scan enable line provided to the control block is buffered by a 1x inverter which feeds a 16x inverter (i.e. the 1x inverter and the 16x inverter are in series). The output of the 16x inverter feeds a pair of 32x inverters. One of the 32x inverters provides a scan enable output from the control block, and the other 32x inverter feeds the scan enable buffers inserted into each row of the control block (the "row scan enable buffers"). A row scan enable buffer in this embodiment is a 1x inverter followed by a 16x inverter in series. The 32x inverter is limited to feeding 100 row scan enable buffers and a maximum of 2 millimeters of wire. Additionally, each row scan enable buffer is limited to feeding 1400 micrometers of wire. Still further, the maximum wire length between elements in the scan chain is 1400 micrometers. If the length between elements is greater than 1400 micrometers, the a 4x buffer is inserted (providing up to 2800 micrometers of total wire length). As used above, a 1x inverter includes transistors of a predetermined width. An Nx inverter includes transistors having a width N times larger than the 1x inverter.

The control block is designed by generating an HDL description of the control block (step 52) and performing synthesis and place and route upon the HDL description to produce a physical layout description (step 54). The HDL and physical layout descriptions are generated without any scan functionality. In this manner, the control block designer may focus upon the functionality and functional timing of the control block. Since scan functionality is not included, the resulting control block is placed and routed in the manner which is most efficient for the functional design.

If the functional design specifications (e.g. timing and area specifications) are not met (decision block 56), steps 52 and 54 are iterated until the functional design specifications are met. Since scan functionality has not been introduced into the design, fewer iterations may be possible to reach a design which meets the specifications. Once specifications have been met, an automated scan insertion tool is used to insert scan functionality and to automatically stitch the scan chain together (step 58). The rules determined in step 50 are used to ensure that the timing of the final design meets the scan timing requirements. Additionally, since scan functionality is inserted after the functional design process is complete, the control block designer is insulated from the scan functionality details. As a result, the design process may be shorter than would otherwise be possible (e.g. if scan insertion occurred prior to completing the functional design).

In one embodiment, the scan insertion tool modifies the HDL description of the control block to insert the scan functionality. The place and route tool is the used to insert the scan functionality into the physical layout description. However, the place and route tool is operated in an Engineering Change Order (ECO) mode to minimize the changes to the functional cells already included in the control block. In the ECO mode, the cells already existing in the physical layout description are frozen in place. Any additional cells (e.g. buffers for scan enable or scan chain interconnect) are inserted in empty space within the control block. Advantageously, the control block should be only minimally perturbed by the insertion of scan functionality. Functional timing should therefore not change appreciably due to the insertion of scan functionality.

Figure 5:
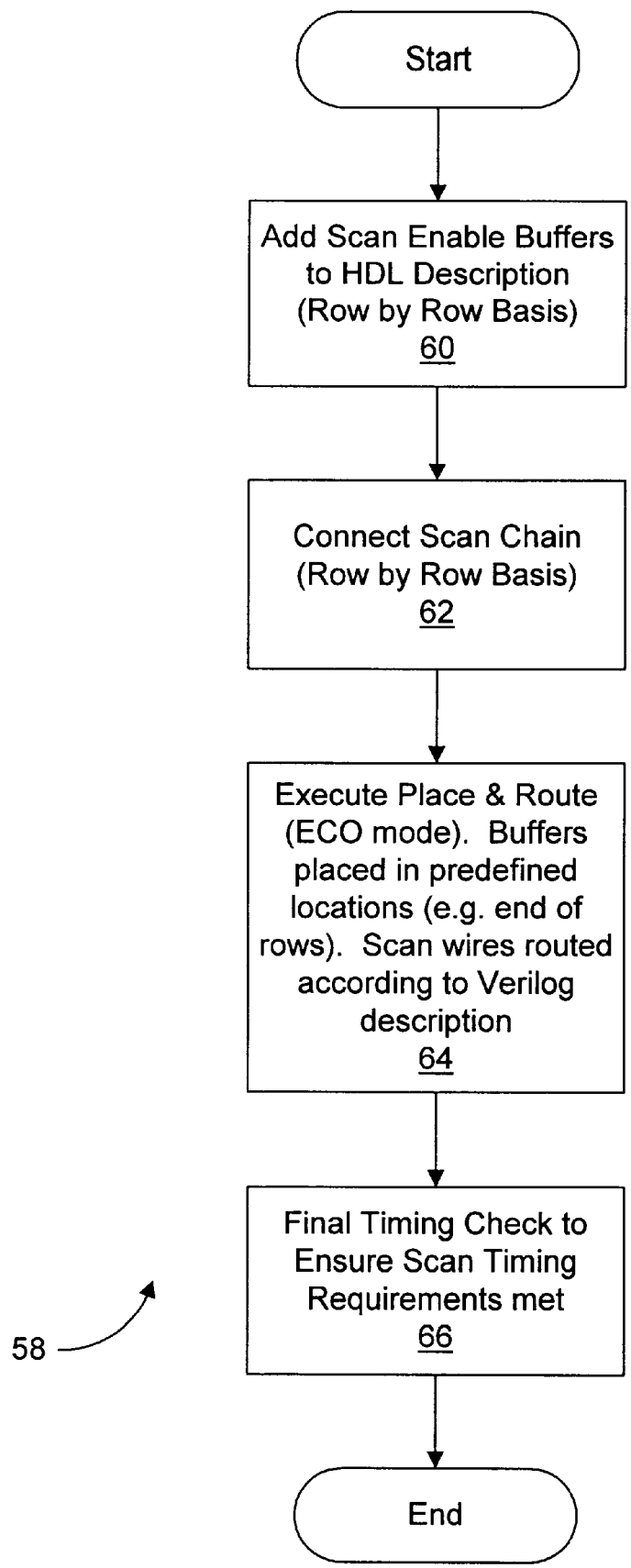
FIG. 5 is a flowchart illustrating an element of the flowchart shown in FIG. 4 in more detail.

Turning now to FIG. 5, a flowchart illustrating one embodiment of the scan insertion step 58 from the flowchart of FIG. 4 is shown. The embodiment shown in FIG. 5 may be used for control blocks arranged as a plurality of rows of cells. Cells in a cell library are typically designed to have approximately the same height. In this manner, the cells may be placed into any row and area is not wasted by a cell which does not occupy most of the height within the row. Different cells may occupy different widths, however.

By examining the physical layout description of the control block, the scan insertion tool can determine the number and placement of the flops within each row. The scan insertion tool then applies the buffering rules derived in step 50 to determine which buffer size is to be inserted as the scan enable buffer for each row. The scan insertion tool modifies the HDL description by instantiating each buffer (step 60). The output of the scan enable buffer for a given row (represented in the HDL description as a signal name) is connected to each flop within the given row (i.e. by inserting the signal name upon the scan enable port of the flop).

Additionally, the scan chain is connected between the flops within the control block (step 62). Again, the scan chain is connected on a row by row basis to minimize the wire lengths within the chain. To further minimize the wire length, flops within the row are connected using a minimum distance algorithm based upon Manhattan routing. Manhattan routing is a routing scheme in which wires are placed either parallel or perpendicular to each of the other wires (i.e. when a turn in a wire is needed, a turn of 90 degrees in either direction is performed). The scan insertion tool performs the scan chain connection by modifying the HDL description, using signal names to indicate connections between scan-in ports and scan-out ports of the various flops. If a particular connection between a particular scan-in port and a particular scan-out port violates the wire length rules established for the scan chain, a buffer is inserted between the particular scan-in port and the particular scan-out port. The buffer is inserted into the HDL description as well.

Once the scan insertion tool has completed steps 60 and 62, the place and route tool is executed in ECO mode to insert the buffers added to the HDL description to the physical layout description (step 64). By executing the scan insertion tool in ECO mode, the placement of the other cells within the control block is frozen. Therefore, functional timing of the control block is not perturbed by the relocation of functional cells. Functional timing may be modified to the extent that wiring between cells may be perturbed by the insertion of scan-related wiring. However, this perturbation is expected to be minimal.

The buffers being inserted are placed in predefined locations within the row. More particularly, in one embodiment, the ends of the rows are used for inserting buffers. An area large enough to accept one or more buffers may be reserved at the end of each row during design iterations to allow for scan buffer insertion. Since buffers are relatively small cells (as compared to other combinatorial cells and flop cells, for example), the reserved area may be a small percentage of the area available within the rows. Alternatively, reserved areas may not be used since the buffers are relatively small cells. Instead, the buffers may be added to the ends of the rows.

The scan wires as specified by the HDL description are also routed by the place and route tool. Since the tool is operating in ECO mode, routing of the scan wires is performed with an attempt to maintain the routing of wires already within the physical layout description. Therefore, timing of the functional portion of the design should be minimally perturbed. Perturbations may occur, for example, due to added parasitic capacitances. However, these perturbations should be minor and should not affect functional timing in an adverse manner to an appreciable degree.

A final timing check is performed by extracting timing-related information from the physical layout description (step 66). Scan timing requirements are checked, as well as checking that functional timing specifications continue to be met.

Figure 6:
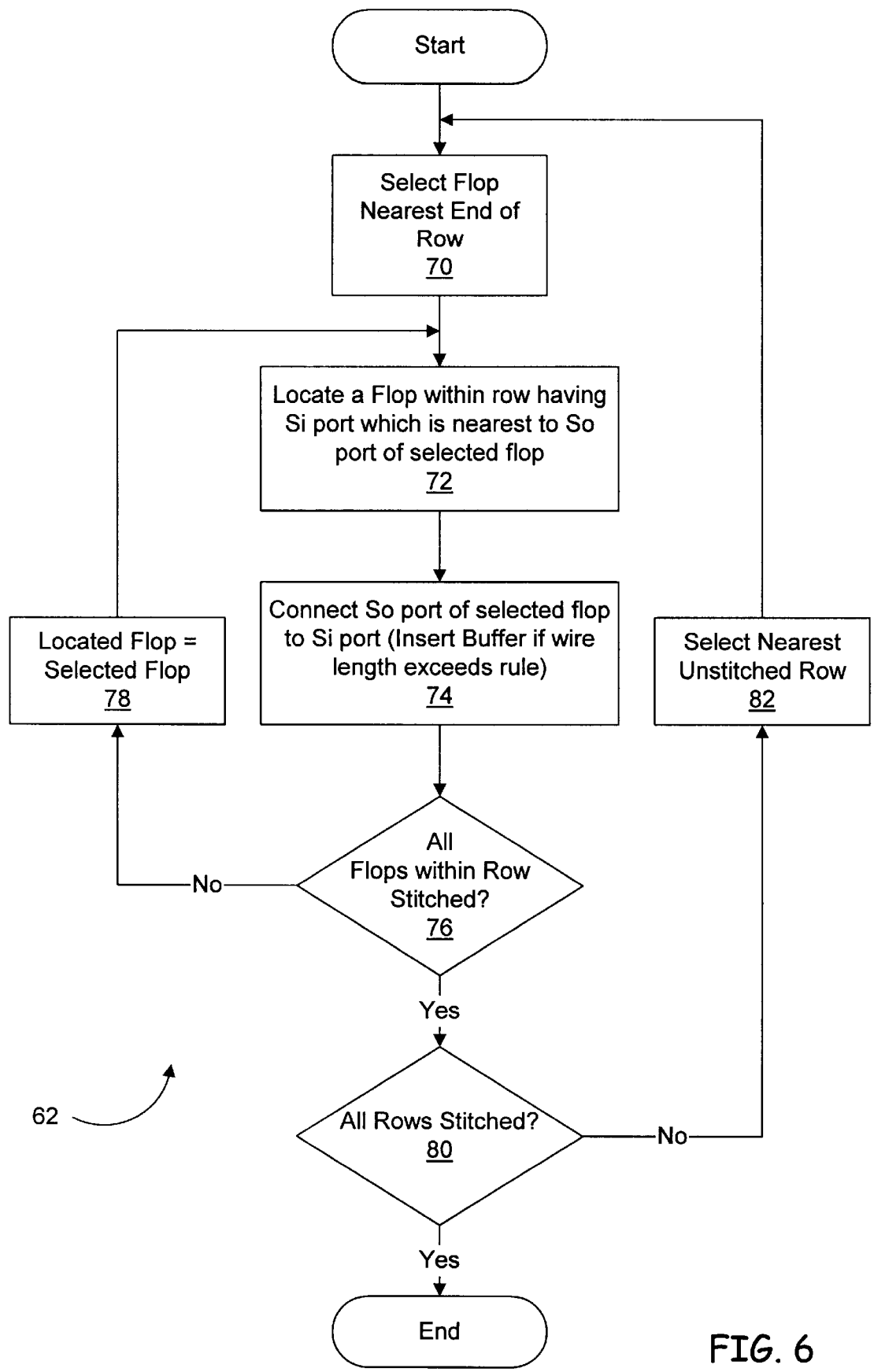
FIG. 6 is a flowchart illustrating an element of the flowchart shown in FIG. 5.

Turning now to FIG. 6, a flowchart illustrating one embodiment of the connection of the scan chain (e.g. step 62 in FIG. 5) is illustrated. The embodiment illustrated in FIG. 6 may be implemented by one embodiment of the scan insertion tool. Other embodiments are contemplated as well. Connecting the flops together into a scan chain is referred to as "scan stitching" or simply "stitching".

A flop which is nearest the end of a row being stitched is selected (i.e. the "selected flop"—step 70). The other flops within the row are then examined to located a flop (the "located flop") having its scan-in port nearest to the scan-out port of the selected flop (step 72). As mentioned above, the distances between the ports is measured using Manhattan routing. Distances between ports are affected by the actual placement of the flops within the row. The placement of the flops can be determined from the physical layout description, which lists the position of each flop within row. The relative positions of the flops represent the distance.

Additionally, the placement of the scan-in and scan-out ports within the flop cell affects the distance between the cell. Finally, the orientation of the flop cell affects distance since the ports position upon the cell is fixed with respect to the cell. Therefore, reorientation of the flop cell causes the ports of the flop cell to move.

The scan-out port of the selected flop is connected to the scan-in port of the located flop (step 74). As mentioned above, the scan insertion tool performs the connection by inserting the same signal name onto the scan-out port of the selected flop (as described in the HDL description) and the scan-in port of the located flop. If, however, the distance between the selected flop and the located flop exceeds the wire length rule for the scan chain, then a buffer is inserted between the scan-out port of the selected flop and the scan-in port of the located flop. In this case, the scan-out port of the selected flop is connected to the input of the buffer, and the output of the buffer is connected to the scan-in port of the located flop.

After connecting the selected and located flops, the scan insertion tool determines if each of the flops within the row have been stitched (i.e. each of the flops includes a connection to its scan-in port—decision block 76). If additional flops remain within the row, the located flop becomes the selected flop with respect to steps 72 and 74 (step 78). Steps 72 and 74 are then repeated.

On the other hand, if each of the flops within the row have been stitched, the scan insertion tool determines if each of the rows within the control block have been stitched (decision block 80). According to one embodiment, the first row of the control block is stitched first (i.e. the row nearest the periphery of one edge of the control block). Subsequent stitching proceeds row by row down the control block. If a particular row contains no flops, that row may be skipped. This method may assist in arriving at a minimum distance connection between each scan-out port and a subsequent scan-in port (e.g. the scan-out port of the last-stitched flop within a row is connected to a scan-in port of a flop within a nearby row). If additional rows remain to be stitched, the nearest unstitched row having flops is selected (step 82). The scan-out port of the located flop from the last stitching iteration of the previous row is connected to the scan-in port of the flop nearest the end of the row selected in step 82 (i.e. step 70 is repeated for the selected row). The end of the row from which the "nearest flop" is selected may be the end of the row nearest the located flop from the previous row, in order to minimize distance of the scan chain wire between the two flops. On the other hand, if a buffer is needed to reach between the located flop and the nearest flop in the selected row, the other end of the row may be used if buffer space is available at the other end. The scan-out port of the located flop is connected to the input of the buffer, and the flop nearest the buffer is selected to have its scan-in port connected to the output of the buffer. Once each of the rows have been stitched, then the embodiment of step 62 shown in FIG. 6 is complete.

It is noted that, although the flowcharts shown herein are shown as a set of steps for accomplishing a goal, any ordering of the steps which produces equivalent results may be used. Additionally, some serially shown steps may occur in parallel but are shown serially to enhance understanding of the methodology.

Figure 7:
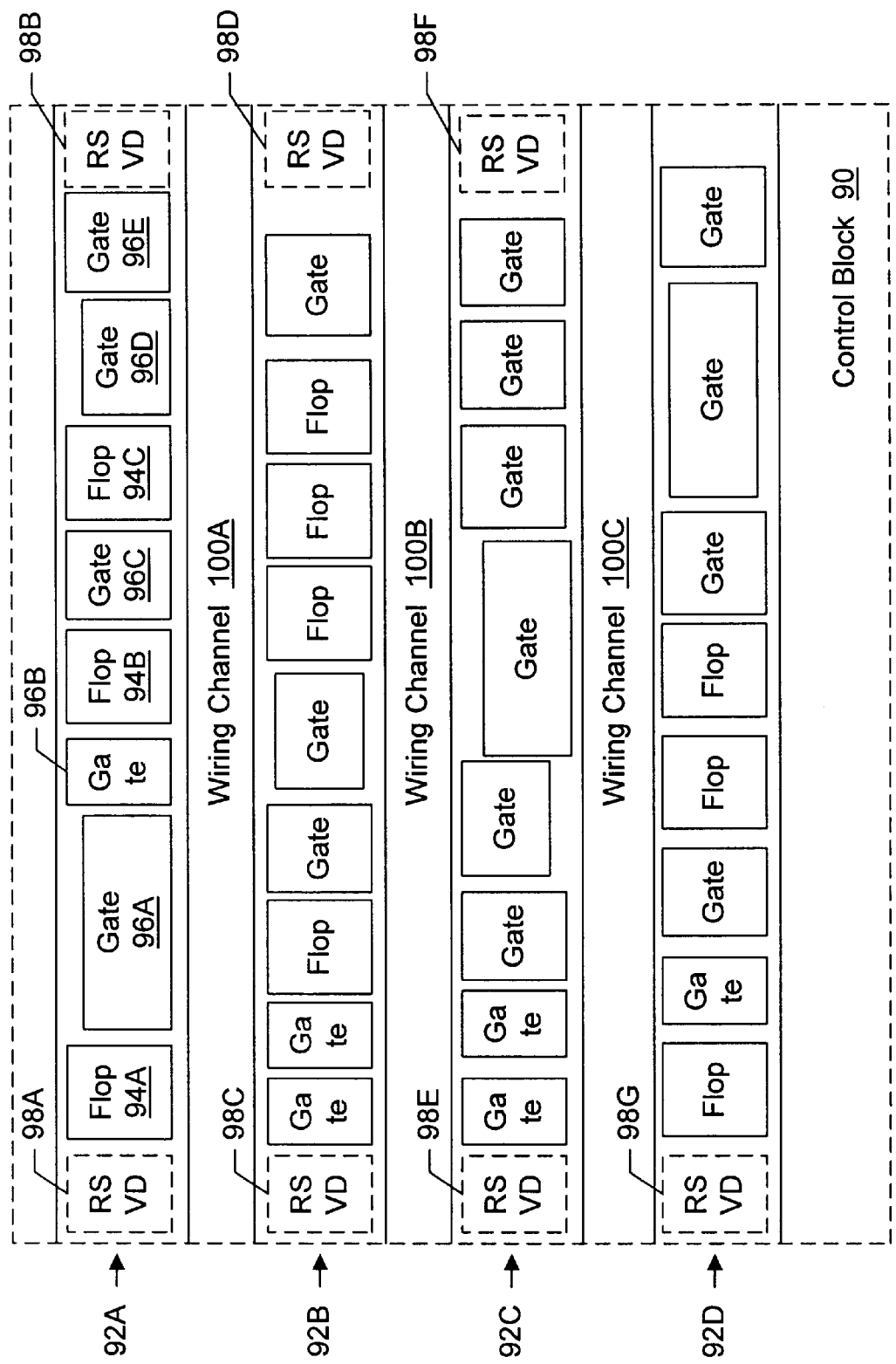
FIG. 7 is a block diagram of one embodiment of a control block layout.

Turning now to FIG. 7, a simplified block diagram of an exemplary physical layout of one embodiment of a control block 90 is illustrated. FIG. 7 illustrates the layout of control block 90 at the cell level (i.e. the internal structure of each cell is omitted in FIG. 7, and instead the boundaries of each cell are shown). Control block 90 is organized as a plurality of rows of cells (e.g. rows 92A–92D as illustrated in FIG. 7). Flop cells are illustrated within various rows 92A–92D (e.g. flop cells 94A–94C within row 92A). Additionally, each row includes other types of cells such as gate cells (e.g. gate cells 96A–96E). Reserved cells 98A–98G are illustrated at the ends of rows 92A–92D. Finally, wiring channels 100A–100C are illustrated between rows 92A–92D. The number of rows within control block 90 may be varied from embodiment to embodiment, as may the number of cells within a row.

Reserved cells 98A–98G are actually not functional cells, but are reserved space for buffers at the end of each row. In this manner, scan enable and scan chain buffers are provided space for insertion at the ends of rows 92A–92D. It is noted that, in other embodiments, space may be reserved within rows 92A–92D as opposed to at an end of a row. It is further noted that FIG. 7 is not to scale in the sense that the amount of space reserved for buffering as a percentage of the row may be smaller than that illustrated. It is still further noted that it may not be necessary to explicitly reserve space for buffers. Embodiments which do not reserve space are contemplated. Additionally, it is noted that an embodiment is contemplated in which space at only one end of each row is reserved.

Gate cells such as gate cells 96A–96E are cells including transistors which form combinatorial logic devices. Simple logic devices such as buffers, inverters, nand gates, nor gates, etc. may be formed within a gate cell. Additionally, more complex cells which implement a combinatorial logic function may be designed. The more transistors included within a cell, the wider the cell may be. Generally, each cell is approximately the same height although some variation in height may be allowed (e.g. gate cell 96A is slightly shorter than other gate cells). Particularly, gate cells 96A–96E do not include storage and therefore are not operated upon by the scan insertion tool when scan functionality is inserted.

Wiring channels 100A–100C are provided to allow for additional wiring. Wiring may be performed above rows 92A–92D, but often times the amount of wiring available above the rows is insufficient for interconnecting all of the cells. For example, a cell in one row may be connected to another cell in the same row or a different row but in a position which is distant from that cell. The wire connecting the two cells may be routed through wiring channels 100A–100C instead of over the intervening cells.

Figure 8:
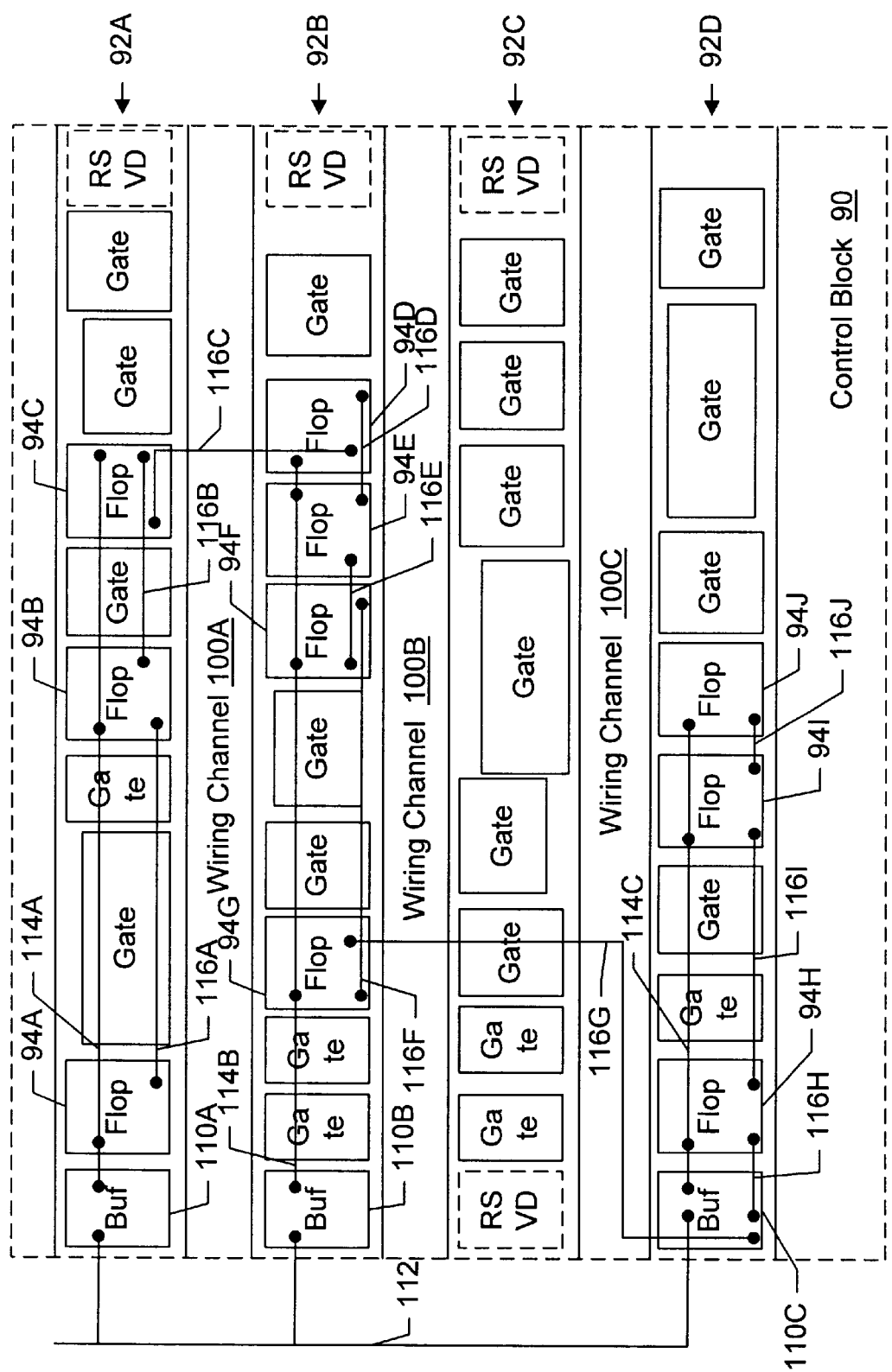
FIG. 8 is a block diagram of the control block layout shown in FIG. 7 after inserting scan functionality.

It is noted that the functional interconnect between gates cells 96A–96E, flop cells 94A–94C, and other gate cells and flop cells shown in FIG. 7 is not shown for clarity in the drawing. Also, FIG. 7 illustrates control block 90 prior to scan insertion and scan stitching. FIG. 8 illustrates the cells and wiring added to perform scan insertion and scan stitching according to one embodiment of the scan insertion tool.

Reserved cells 98A, 98C, and 98G have been replaced in FIG. 8 with buffer cells 110A, 110B, and 110C, respectively. As mentioned above, reserving space for buffers may not be necessary in contemplated embodiments. For such embodiments, buffer cells 110A–110C are placed at the ends of the rows. Input ports of each buffer cell 110A–110C are coupled to a scan enable line 112 which is routed to a source of the scan enable signal. The source of the scan enable signal may, for example, be a pin of the control block 90. The output ports of each scan buffer 110A–110C are connected by respective wires 114A–114C to the scan enable ports of each flop cell within the row corresponding to that scan buffer 110A–110C. For the example shown in FIG. 8, the scan enable port is in the upper left hand corner of a normally-oriented flop cell (e.g. flop cells 94A–94B). On the other hand, a flop cell which has been flipped about its vertical axis (such as flop cell 94C) has the scan enable port in the upper right hand corner. Additionally, the scan-in port of a normally-oriented flop cell is in the lower left hand corner and the scan-out port of a normally oriented flop cell is in the lower right hand corner. For flops which are flipped about their vertical axis, the scan-in port is on the lower right hand corner and the scan-out port is in the lower left hand corner. For this example, no flops are included in a 90 degree rotated fashion. It is understood that ports may be located anywhere within the cell as a matter of design choice.

Flop cell 94A is selected as being nearest the end of the first row and receives a scan-in input from outside of control block 90 (not shown). The scan-out port of flop cell 94A is coupled to the nearest scan-in port within row 92A (i.e. the scan-in port of flop cell 94B, connected by wire 116A). Similarly, the scan-out port of flop 94B is coupled via a wire 116B to the scan-in port of flop 94C.

Since flop 94C is the last flop to be connected into the scan chain within row 92A, the scan-out port of flop 94C is coupled to the scan-in port of a flop within row 92B (e.g. flop 94D). In this example, the length of the wire 116C used to connect flops 94C and 94D is less then the wire length rule for the scan chain. Therefore, the wire can be routed directly. Subsequently, flops 94E–94G are coupled into the scan chain via wires 116D–116F as illustrated in FIG. 8.

Flop cell 94G is the last flop within row 92B to be connected into the scan chain. Row 92C does not include an flop cells, and therefore is skipped. In row 92D, flop cell 94H is nearest the end of the row to which flop cell 94G is nearest. However, a hypothetical wire between flop cell 94G and flop cell 94H exceeds the wire length rule for the scan chain in this example. Therefore, a wire 116G is connected between the scan-out port of flop cell 94G and an input port of a scan chain buffer within buffer cell 110C. For this example, buffer cell 110C includes two buffer circuits. Therefore, buffer cell 110C may provide a scan enable buffer as well as a scan chain buffer. Alternatively, two buffer cells may be inserted into row 92D (one for the scan enable buffer and the other for the scan chain buffer). A wire 116H is connected between the output port of the scan chain buffer within buffer cell 110C and the scan-in port of flop cell 94H. Similarly, flop cells 94I and 94J are coupled into the scan chain via wires 116I and 116J. Flop cell 94J provides the end of the scan chain. The scan-out port of flop cell 94J is connected to a scan-out output from control block 90 (not shown).

FIG. 8 illustrates that scan functionality can be inserted after the functional design of control block 90 is substantially complete. The design perturbation may be minimal (if any), and the scan functionality meets timing requirements. Furthermore, the scan insertion can be performed automatically. The designer of control block 90 is therefore insulated from the details of scan.

Figure 9:
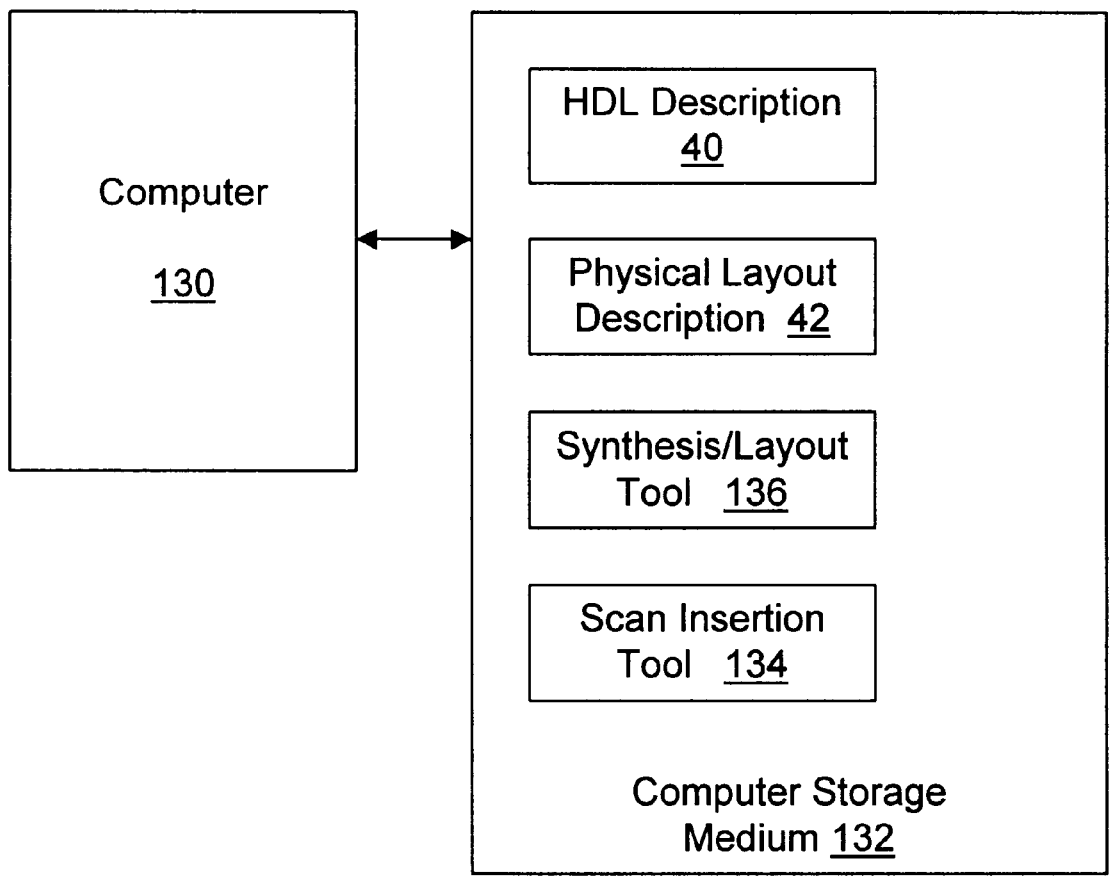
FIG. 9 is a block diagram of a computer system configured to insert scan functionality into a control block design.

Turning next to FIG. 9, an exemplary computer 130 is shown coupled to an exemplary computer storage medium 132. Computer 130 is any kind of general purpose computing device (e.g. a personal computer or a workstation such as those available from Sun Microsystems, Inc. of Palo Alto, Calif.). Computer storage medium 132 is a storage device configured to store programs and data for use by computer 130. Storage medium 132 may be a short term volatile storage such as a random access memory (RAM), or a longer term storage such as a hard disk drive, a floppy disk, a CD-ROM, or other such storage medium. Computer 130 may access computer storage medium 132 to read programs or data to be operated upon by programs. Data generated by executing the programs may be stored onto computer storage medium 132 if computer storage medium 132 is updateable via computer 130.

For the example of FIG. 9, computer storage medium 132 stores scan insertion tool 134. Scan insertion tool 134 comprises a set of instructions arranged to perform scan insertion and scan stitching functions as described herein. Additionally, computer storage medium 132 may store synthesis/layout tool 136. Synthesis/layout tool 136 may include a synthesis tool for performing synthesis, a place and route tool for performing place and route, and a timing analyzer for performing timing analysis. Still further, physical layout description 42 and HDL description 40 may be stored within computer storage medium 132.

In accordance with the above disclosure, a scan insertion methodology has been described which automatically inserts scan functionality into a control block design. Scan functionality can be inserted with minimal effect upon the functional portion of the control block. Additionally, the scan functionality can be inserted automatically. The control block designer is thereby insulated from the details of the scan test functionality.

Numerous variations and modifications will become apparent to those skilled in the art once the above disclosure is fully appreciated. It is intended that the following claims be interpreted to embrace all such variations and modifications.

What is claimed is:

1. A method for scan insertion into a control block, comprising:
    inserting at least one scan enable buffer at an end of a row of cells within said control block;
    connecting an output of said scan enable buffer to a scan enable port of at least one scannable storage device within said row; and
    connecting said scannable storage device into a scan chain.

2. The method as recited in claim 1 wherein said connecting said scannable storage device comprises connecting a scan-out port of a first scannable storage device within said row to a scan-in port of a second scannable storage device within said row.

3. The method as recited in claim 2 wherein said connecting said scan-out port comprises selecting said second scannable storage device from said at least one scannable storage device within said row.

4. The method as recited in claim 3 wherein said scan-in port of second scannable storage device is a first distance from said scan-out port as defined in a physical layout description of said control block, wherein said first distance is less than a distance from each other scan-in port of other ones of said at least one scannable storage device.

5. The method as recited in claim 4 wherein said first distance is less than said distance according to Manhattan routing.

6. The method as recited in claim 4 wherein said connecting said scan-out port further comprises inserting a scan chain buffer between said scan-out port and said scan-in port if said first distance exceeds a predetermined maximum line length.

7. The method as recited in claim 1 wherein said inserting comprises modifying a high level design language (HDL) description of said control block to include said scan enable buffer.

8. The method as recited in claim 7 wherein said inserting further comprises executing a place and route tool upon said HDL description and a corresponding physical layout description, said place and route tool operating in an engineering change order (ECO) mode whereby a placement of said cells within said row is maintained as said scan enable buffer is inserted.

9. The method as recited in claim 1 wherein said connecting an output comprises modifying a high level design language (HDL) description of said control block to include a connection of said output to said scan enable port upon each of said at least one scannable storage device.

10. The method as recited in claim 9 wherein said connecting said output further comprises executing a place and route tool upon said HDL description and a corresponding physical layout description, said place and route tool operating to route a wire corresponding to said connection within said physical layout description.

11. The method as recited in claim 1 further comprising evaluating said control block to ensure that timing requirements of said control block are achieved.

12. The method as recited in claim 1 wherein said scannable storage devices comprise flops.

13. A method for designing a control block including scan functionality comprising:
designing said control block exclusive of said scan functionality, said control block comprising a plurality of rows of cells;
inserting a first scan enable buffer at an end of a first one of said plurality of rows upon completing said designing;
connecting an output of said first scan enable buffer to a scan enable port upon each of a first plurality of scannable storage devices within said first one of said plurality of rows; and
connecting said first plurality of scannable storage devices into a scan chain.

14. The method as recited in claim 13 further comprising connecting a second plurality of scannable storage devices within another one of said plurality of rows into said scan chain.

15. The method as recited in claim 14 further comprising inserting a second scan enable buffer at an end of said another one of said plurality of rows and connecting an output of said second scan enable buffer to a scan enable port upon each of said second plurality of scannable storage devices.

16. The method as recited in claim 13 wherein said first plurality of scannable storage devices comprise flops.

17. A computer storage medium configured to store a scan stitching program including a plurality of instructions configured:
to insert at least one scan enable buffer into a high level design language (HDL) description of a control block;
to connect an output of said scan enable buffer to a scan enable port upon each of a plurality of scannable storage devices within said HDL description, said plurality of scannable storage devices within one of a plurality of rows of said control block as defined within a corresponding physical layout description of said control block; and
to connect said plurality of scannable storage devices into a scan chain, said scan chain built between said plurality of scannable storage devices according to a minimum Manhattan distance between scan-in ports and scan-out ports of said plurality of scannable storage devices.

18. The computer storage medium as recited in claim 17 wherein said plurality of instructions are further configured:
to connect a second plurality of scannable storage devices into said scan chain, said second plurality of scannable storage devices within a second one of said plurality of rows;
to insert a second scan enable buffer into said HDL description; and
to connect an output of said second scan enable buffer to a scan enable port upon each of said second plurality of scannable storage devices.

* * * * *